United States Patent [19]

Löwel

[11] Patent Number: 4,922,126

[45] Date of Patent: May 1, 1990

[54] CIRCUIT FOR SHAPING A MEASUREMENT-SIGNAL VOLTAGE INTO A SQUARE-WAVE SIGNAL

[75] Inventor: Helmut Löwel, Nuremberg, Fed. Rep. of Germany

[73] Assignee: Alcatel N.V., Amsterdam, Netherlands

[21] Appl. No.: 175,496

[22] Filed: Mar. 30, 1988

[30] Foreign Application Priority Data

Apr. 1, 1987 [DE] Fed. Rep. of Germany ....... 3710871

[51] Int. Cl.$^5$ .................... H03K 17/90; H03K 17/72; H03K 19/18
[52] U.S. Cl. .................................. 307/261; 307/305; 307/309; 307/318; 307/358; 328/32; 330/62
[58] Field of Search ............... 307/306, 761, 308, 309, 307/310, 311, 358, 318, 305; 328/5, 32 R; 330/62

[56] References Cited

U.S. PATENT DOCUMENTS

| | | | |
|---|---|---|---|
| 3,233,116 | 2/1966 | Watrous | 307/642 |
| 3,813,565 | 5/1974 | Guilleux | 307/308 |
| 3,829,717 | 8/1974 | Harrison | 307/310 |
| 4,535,294 | 8/1985 | Ericksen et al. | 307/261 |
| 4,611,129 | 9/1986 | Ishihara | 307/308 |
| 4,835,415 | 5/1989 | Lowel | 307/261 |

FOREIGN PATENT DOCUMENTS

| | | | |
|---|---|---|---|
| 0225020 | 7/1985 | Fed. Rep. of Germany | 307/260 |
| 2438845 | 5/1980 | France . | |
| 105623 | 6/1983 | Japan . | |
| 5962 | 1/1984 | Japan . | |

OTHER PUBLICATIONS

Carter et al., "Voltage Source Direction Detector with Digital Output", IBM Technical Disclosure Bulletin, vol. 18, No. 17, Dec. 1975.
"Magnetoresistive Sensoren im Kfz", Elektronik, 10, May 17, 1985, by Petersen, pp. 99–102.

Primary Examiner—Stanley D. Miller
Assistant Examiner—Huy K. Mai
Attorney, Agent, or Firm—Spencer & Frank

[57] ABSTRACT

To derive a stable square-wave signal from a measurement-signal voltage obtained from a voltage divider and containing a DC component and an AC component, the low end of the voltage divider is grounded through a load resistor shunted by the series combination of a resistor and a grounded capacitor. The low end is connected through the resistor to the negative input of a comparator and through an additional resistor to the positive input of the comparator. This positive input is also connected through a feedback resistor to the output of the comparator. The low end is connected to the supply voltage ($U_V$) via a second voltage divider whose first resistor is formed by a controllable, temperature-stabilized zener diode connected to the supply voltage ($U_V$) through the second resistor of the second voltage divider. The measurement-signal voltage ($U_M$) obtained from the tap of the first voltage divider is applied to the control electrode of the zener diode.

9 Claims, 1 Drawing Sheet

CIRCUIT FOR SHAPING A MEASUREMENT-SIGNAL VOLTAGE INTO A SQUARE-WAVE SIGNAL

BACKGROUND OF THE INVENTION

The present invention relates to a circuit for shaping a measurement-signal voltage into a square-wave signal.

A circuit of this kind is described in the journal "Elektronik", No. 10, May 17, 1985, p. 100. There an operational amplifier connected as a Schmitt trigger is used for shaping a measurement signal into a square-wave signal. The amplified measurement signal is applied to the positive input of the operational amplifier, and the supply voltage to the other, negative input. The supply voltage is assumed to be constant, so that a stabilized supply voltage must be present. Errors in the measurement signal are corrected by means of a voltage divider which includes a positive temperature coefficient resistor; that is, a resistor whose resistance increases with an increase in its temperature, and has its tap connected to one of the inputs of an operational amplifier. This gives a temperature-controlled current source for a sensor whose measurement-signal voltage is to be shaped. For temperature compensation, resistors which are not otherwise necessary are connected into the leads to the inputs of an operational amplifier.

SUMMARY OF THE INVENTION

It is the object of the present invention to obtain an error-corrected square-wave output voltage with little circuitry and with components of minimum size.

This object is attained by a circuit which eliminates the need for a stabilized supply voltage and special temperature control.

This object and others to become apparent as the specification progresses, are accomplished by the invention, according to which briefly stated is a circuit for shaping a measurement-signal voltage obtained from a voltage divider containing a DC component and an AC component into a square-wave signal. The voltage divider has a low end which is grounded through a load resistor. The load resistor is shunted by a series combination of a resistor and a grounded capacitor. The low end is connected through the resistor to a negative input of a comparator and through an additional resistor to the positive input of the comparator. The positive input is also connected through a feedback resistor to the output of the comparator. Additionally, the low end is connected to the supply voltage through a second voltage divider. The second voltage divider has a controllable, temperature-stabilized zener diode which forms a first resistor. The diode is connected through a second resistor of the second voltage divider to the supply voltage and has a control electrode which is subjected to the measurement-signal voltage obtained from the tap of the first voltage divider.

Further advantageous details of the invention are set forth in the preferred embodiment of the invention which will now be described with reference to the accompanying drawings.

DESCRIPTION OF THE PREFERRED EMBODIMENTS

Figure 2:
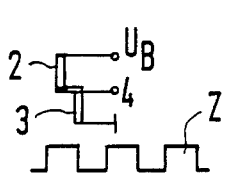
FIG. 2 shows how magnetoresistors are positioned relative to the teeth of a gear or rack.
Figure 3:
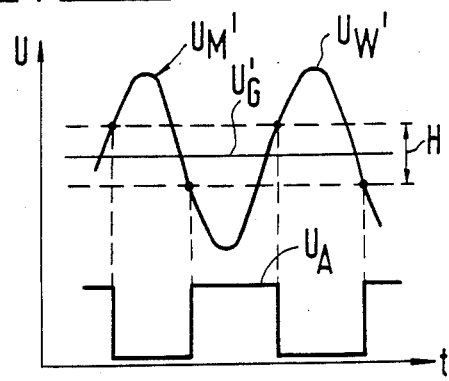
FIG. 3 shows a graph of an amplified measurement signal and a square-wave signal derived therefrom.

The reference numeral 1 denotes a voltage divider consisting of two magnetoresistors 2 and 3. If the teeth of a gear or rack are spaced at regular intervals, the magnetoresistors 2 and 3 are displaced in relation to one another by a quarter of the tooth pitch, as shown in FIG. 2. The voltage divider 1 may also consist of only one magnetoresistor and a normal resistor. It gets its operating voltage $U_B$ from a supply voltage $U_V$ via a dropping resistor 4.

Figure 1:
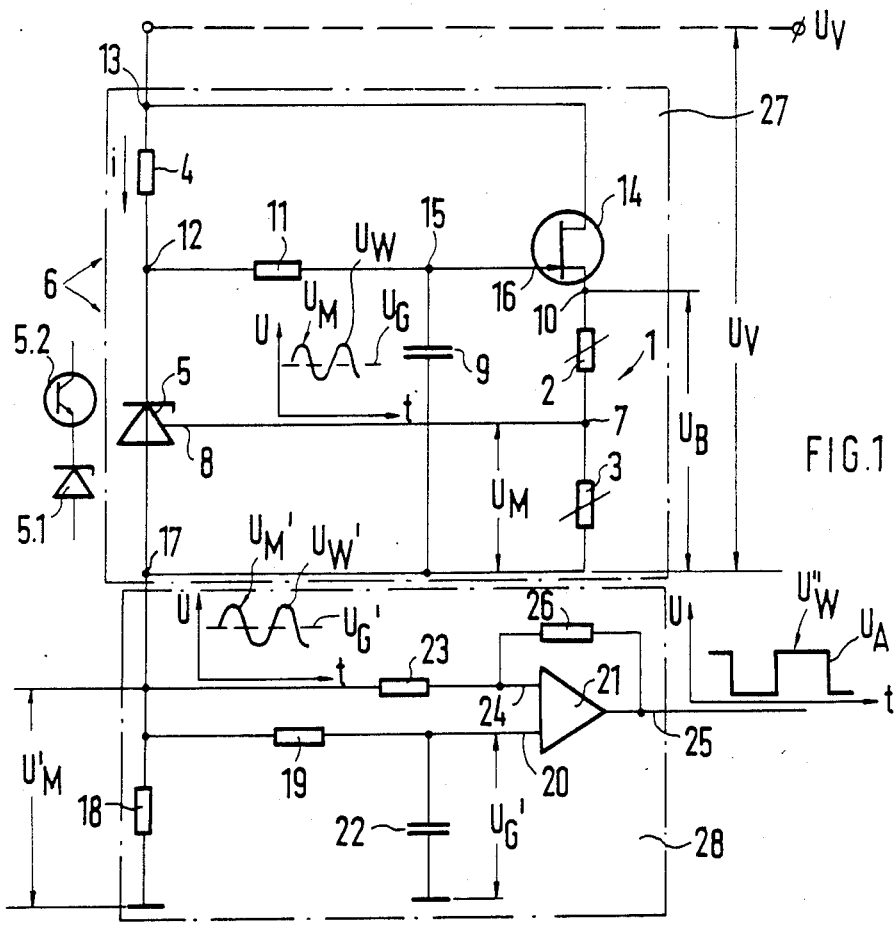
FIG. 1 shows a circuit with an RC section connected to the first voltage divider.

Connected in parallel with the voltage divider 1 is a controllable impedance 5, preferably a controllable zener diode, such as the IC type TL 431, or, as shown beside FIG. 1, a zener diode 5.1 in series with the emitter-collector path of a transistor 5.2. This controllable impedance 5 and the dropping resistor 4 form a second voltage divider 6. The tap 7 of the first voltage divider 1 is connected to the control input 8 of the controllable impedance 5. Also connected in parallel with the first voltage divider 1 is a capacitor 9, and a resistor 11 is interposed between the high end 10 of the voltage divider 1 and the tap 12 of the second voltage divider 6. The resistor 11 and the capacitor 9 form a timing section whose time constant is longer than the longest period of the AC voltage component $U_W$ at the tap 7 of the voltage divider 1, preferably 5 to 20 times as long.

If the integrated controllable impedance is of the aforementioned type TL 431, any changes in the values of the circuit, such as temperature changes or aging, and thus changes in the resistances of the magnetoresistors 2 and 3 or the other circuit components will be compensated for because this integrated circuit incorporates internal temperature compensation. Therefore, the output signal is highly stable.

To keep the size and, hence, the values of the circuit components small, the drain-source path of a field-effect transistor 14 is connected from the high end 10 of the first voltage divider 1 to the high end 13 of the dropping resistor 4 and, thus, to the supply voltage $U_V$, and the junction 15 of the capacitor 9 and the resistor 11 is connected to the gate 16 of the field-effect transistor 14 and, thus, via the very high-impedance gate-source path to the high end 10. The field-effect transistor 14 acts as an impedance-matching transformer and holds the high end 10 at a constant potential. Because of the very high input resistance of the field-effect transistor 14, only very small currents on the order of, e.g., a few picoamperes will flow in the gate-source path. The capacitor 9 can thus be made very small. In a practical embodiment, the value of the resistor 11 was of the order of about 10 megohms to a few 10 megohms, and the value of the capacitor 9 was of the order of 100 nF.

The circuit can be built with few small-size components, so that it can be combined into a structural unit and housed in a single package which is provided with only two leads. The components 18 to 26 are contained in a second unit, which can be easily mounted wherever required.

The operation of the circuit is as follows.

A ferromagnetic gear or rack Z, which may be magnetized, is moving relative to the two magnetoresistors 2, 3. If the gear or rack is not magnetized, the magnetoresistors have a permanent magnet associated therewith in a manner known per se. The magnetic field of the permanent magnet passes through the magnetoresistors, and its direction in the magnetoresistors is changed by the external ferromagnetic part, thereby changing the resistances of the magnetoresistors. As the teeth of the gear Z move past the magnetoresistors 2, 3, which are displaced in relation to one another by a quarter of the tooth pitch, the resistance value of one magnetoresistor, e.g., 2, increases, and that of the other, 3, decreases, periodically, and vice versa, from the same standard value. Thus, a measurement signal $U_M$ consisting of a DC component $U_G$ and an alternating component $U_W$ superimposed thereon is obtained at the tap 7. The measurement signal $U_M$ controls the impedance 5 in such a way that the voltage at the tap 12 increases as the voltage at the tap 7 decreases. Without the capacitor 9 and the resistor 11, this would necessitate increasing the operating voltage $U_B$ across the first voltage divider 1 until the voltage at the tap 7 equals the reference voltage at the control input of the controllable impedance 5. In the case of the IC type TL 431, this reference voltage is 2.5 V.

Because of the long time constant of the RC section 9, 11 in connection with the high-impedance gate-source path of the field-effect transistor 14, the change in the value of the impedance 5 has no effect at the first voltage divider 1, i.e., no control takes place. The change in the impedance of the second voltage divider 6 causes a change in the current flowing through this voltage divider, so that the measurement signal $U_M$ is amplified.

A load resistor 18 is connected from the low end 17 of the first voltage divider 1, which is coupled to the anode of the controllable zener diode 5, to ground. This load resistor 18 can be attached at any external point if the aforementioned circuit is combined to form a structural unit. The circuit therefore has only two input leads, namely the lead connecting the load resistor 18 to the low end 17 and the lead for the supply voltage $U_V$.

To change the amplified measurement signal $U_M'$ obtainable from the low end 17 into a square-wave output voltage $U_A$, the low end 17 is connected via a resistor 19 to the negative input 20 of an operational amplifier 21 used as a comparator, and the input 20 is grounded through a capacitor 22. Thus, the DC component $U_B'$ appears across this capacitor. The low end 17 is also connected through a resistor 23 to the positive input 24 of the operational amplifier 21. Connected between the positive input 24 and the output 25 of the operational amplifier 21 is a feedback resistor 26. The threshold voltages of the operational amplifier 21, which is used as a comparator, and thus the hysteresis H are determined by the values chosen for the resistors 23 and 26, so that by comparing the amplified measurement-signal voltage $U_M'$ with the DC component $U_G'$, a temperature-stabilized square-wave voltage $U_W''$ is obtained as the output voltage $U_A$ at the output 25 of the operational amplifier 21.

To achieve a highly stable square-wave output signal $U_A$, only two separately mountable circuit modules 27 and 28 with few, small-size components are thus necessary, one for generating the amplified measurement-signal voltage $U_M'$ and one for generating the square-wave voltage $U_A$.

I claim:

1. A circuit for shaping a measurement-signal voltage having a DC component and an AC component, into a square-wave signal, comprising a first voltage divider having a low end grounded through a load resistor, said load resistor being shunted by a series combination including a resistor and a grounded capacitor, the low end of said first voltage divider being connected through the resistor to a negative input of a comparator and an additional resistor to the positive input of the comparator, said positive input being connected through a feedback resistor to the output of the comparator, and the low end of said first voltage divider being connected to the supply voltage through a second voltage divider, said second voltage divider having a controllable, temperature-stabilized zener diode forming a first resistor, said diode being connected through a second resistor of the second voltage divider to the supply voltage and having a control electrode subjected to the measurement-signal voltage obtained from a tap of the first voltage divider.

2. A circuit as claimed in claim 1, wherein at least one resistor of two resistors in the first voltage divider is a magnetoresistor, said first voltage divider having a high end connected by a further resistor to a tap of the second voltage divider, a further capacitor connected between the high end and the low end of the first voltage divider, and said further resistor and said further capacitor forming a timing section having a time constant which is longer than the period of the AC component of the measurement signal voltage.

3. A circuit as claimed in claim 2, wherein said high end of the first voltage divider is connected to the supply voltage through a drain-source path of a field-effect transistor, and the junction of the further resistor and the further capacitor is connected to the gate terminal of the field-effect transistor.

4. A circuit for generating a stable square-wave output signal from a measurement-signal voltage having DC and AC components, comprising:
- a voltage divider including first and second series-connected resistive elements having a tap therebetween, the resistance of at least one of said resistive elements being variable with respect to the other resistive element to produce at said tap said measurement-signal voltage;
- zener diode means having a control electrode connected to the tap of said voltage divider, said zener diode means being connected directly to one end of said voltage divider and to the other end of said voltage divider through a first resistor;
- a first capacitor connected across said voltage divider, the time constant of said first resistor and said first capacitor being greater than the period of the AC component of said measurement-signal voltage;
- a load resistor having one end coupled to the junction of said voltage divider and said zener diode means and the other end to a reference potential, the voltage across said load resistor corresponding to an amplified version of said measurement-signal voltage;
- a comparator having negative and positive inputs and an output, the negative and positive inputs of said comparator being connected to the one end of said load resistor by second and third resistors respectively;
- a second capacitor connected between the negative input of said comparator and said reference potential, the DC component of the amplified version of said measurement-signal voltage across said load resistor appearing across said second capacitor;
- a feedback resistor connected between the positive input and the output of said comparator, the threshold voltage of said comparator being determined by said third and feedback resistors; and means coupling a supply voltage to the other end of said voltage divider and to the junction of said zener diode means and said first resistor, said output signal being generated at the output of said comparator.

5. A circuit as claimed in claim 4 wherein at least one of said first and second resistive elements comprising said voltage divider is a magnetoresistor.

6. A circuit as claimed in claim 4 wherein said means coupling a supply voltage to the other end of said voltage divider is a field-effect transistor and to said zener diode means is a fourth resistor, said field-effect transistor maintaining the other end of said voltage divider at a constant potential.

7. A circuit as claimed in claim 4 wherein said zener diode means comprises a controllable temperature-stabilized zener diode having said control electrode, an anode and a cathode.

8. A circuit as claimed in claim 7 wherein said first resistor is connected to the anode of said zener diode and said load resistor is connected to the cathode thereof.

9. A circuit as claimed in claim 4 wherein said zener diode means comprises a series-connected zener diode and a transistor, the emitter of said transistor being connected to the anode of said zener diode, the collector of said transistor being connected to said first resistor, the base of said transistor being connected to the tap on said voltage divider and cathode of said zener diode to the one end of said load resistor.

* * * * *